United States Patent
Tassilo

(10) Patent No.: US 7,677,383 B2
(45) Date of Patent: Mar. 16, 2010

(54) GUIDE PATH FOR ELECTRONIC COMPONENTS

(75) Inventor: Drögsler Tassilo, Rimsting (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 100 days.

(21) Appl. No.: 11/883,874

(22) PCT Filed: Nov. 30, 2006

(86) PCT No.: PCT/EP2006/011528

§ 371 (c)(1),
(2), (4) Date: Jan. 7, 2008

(87) PCT Pub. No.: WO2007/065599

PCT Pub. Date: Jun. 14, 2007

(65) Prior Publication Data

US 2008/0156706 A1    Jul. 3, 2008

(30) Foreign Application Priority Data

Dec. 8, 2005    (DE) .................. 10 2005 058 704

(51) Int. Cl.
*B65G 47/24* (2006.01)
(52) U.S. Cl. .................. 198/417; 198/389; 193/46
(58) Field of Classification Search .............. 198/417, 198/389, 390; 193/46
See application file for complete search history.

(56) References Cited

U.S. PATENT DOCUMENTS

| | | | | | |
|---|---|---|---|---|---|
| 2,863,588 | A | * | 12/1958 | Stover | 198/443 |
| 4,174,028 | A | * | 11/1979 | Barnes | 198/389 |
| 4,469,229 | A | * | 9/1984 | Cronan | 209/544 |
| 4,703,858 | A | | 11/1987 | Ueberreiter et al. | |
| 4,993,588 | A | | 2/1991 | Willberg et al. | |
| 5,117,963 | A | * | 6/1992 | Thayer et al. | 198/395 |
| 5,775,478 | A | * | 7/1998 | Shinjo | 198/389 |
| 6,032,783 | A | * | 3/2000 | Saito et al. | 198/390 |
| 6,401,909 | B2 | | 6/2002 | Heigl | |
| 6,788,805 | B1 | * | 9/2004 | Fukushima et al. | 382/141 |

FOREIGN PATENT DOCUMENTS

| | | |
|---|---|---|
| DE | 86 32 512.4 | 3/1987 |
| DE | 39 09 971 A1 | 10/1990 |
| JP | 63218421 A * 9/1988 | 198/417 |

OTHER PUBLICATIONS

International Search Report for PCT/EP2006/011528 mailed Mar. 20, 2007.

* cited by examiner

*Primary Examiner*—Mark A Deuble
(74) *Attorney, Agent, or Firm*—Nixon & Vanderhye PC

(57) ABSTRACT

A guide path for electronic components has guide elements by means of which the components are guided obliquely with respect to the direction of the light beams at least in the area of a light barrier, such that the component produces a shadow area which is higher than the side end surface of the component.

5 Claims, 1 Drawing Sheet

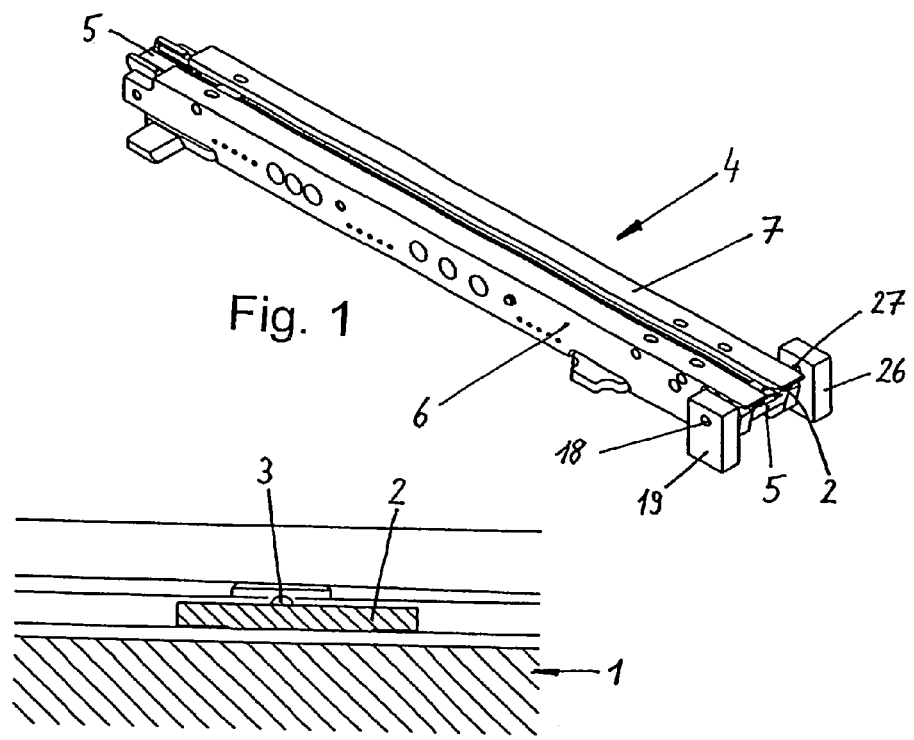
Fig. 1
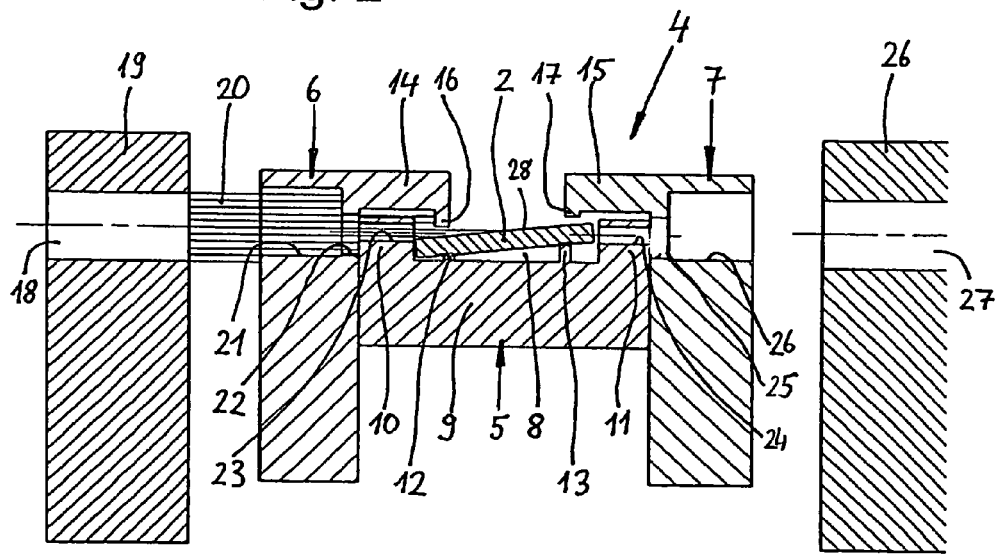
Fig. 2
Fig. 3

GUIDE PATH FOR ELECTRONIC COMPONENTS

This application is the U.S. national phase of International Application No. PCT/EP2006/011528, filed 30 Nov. 2006 which designated the U.S. and claims priority to DE 10 2005 058 704.6, filed 8 Dec. 2005, the entire contents of each of which are hereby incorporated by reference.

The invention relates to a guide path for electronic components, with a guide channel, in which the components are conducted past a light barrier which detects the components.

Such guide paths are found, for example, in automatic handling devices for electronic components, referred to as handlers.

Automatic handling devices of this kind are used, for example, in order to conduct the electronic components, in particular IC's, to a temperature chamber or a test device, in order to test the electrical properties and the perfect function of the components. In the guide paths, the components are preferably moved onwards by their own force of gravity.

In order to detect the presence or absence of an electronic component at a specific point on the guide path, light barriers are conventionally used, wherein transmitters and receivers of the light barrier are located on opposite sides of the guide path. If a component passes into the area of the light beam bundle being emitted by the transmitter of the light barrier, the light beams are interrupted and the receiver side put into darkness. The change in brightness leads to a change in the switch state of the light barrier, with the result that it can be identified from this when a component is located in the area of the light barrier.

The principle is known of arranging light barriers either to the side next to the guide paths or above and below the guide paths (or in front of or behind them respectively). With the lateral arrangement, the upper and lower main surfaces of the component lie parallel to the light beams, i.e. the light beams fall perpendicularly onto a narrow side face surface of the component. The advantage of this lateral arrangement lies in the fact that the guide paths are easily accessible. It is, however, problematic that, in particular with very thin electronic components, there is the risk that the light beams emitted by the transmitter of the light barrier are not interrupted to an adequate degree and individual light beams can pass by unimpeded at the side of the component to the receiver, with the result that it cannot always be definitely determined whether a component is in the area of the light barrier or not.

This problem is further exacerbated by the fact that the components must have a certain degree of play within the guide channel in order to be able to slide forwards unimpeded. Because the thicknesses of the components have certain tolerances, this play can also be adapted to the maximum permissible thickness of the component. In particular with very steep or vertically arranged guide paths, the individual components may, therefore, lie in different ways in the guide channel, which renders the unambiguous darkening of the light barrier receiver difficult. This problem is exacerbated by light reflections in the guide channel.

To avoid these problems which arise with lateral light barrier arrangements, the principle is known of providing diaphragms with small light passage apertures between the transmitter and the guide channel on the one hand and the receiver on the other, so that only one fine light beam bundle with low cross-section is sent through the guide channel. There are limits set on the reduction in the size of the light beam bundle, however, since normal light barriers require a specific light intensity on the receiver side in order to function perfectly. Very sensitive light barriers with high quality light conductor amplifiers and light wave conductors are, by contrast, correspondingly expensive. Furthermore, the manufacture of diaphragms with very small light passage apertures with a diameter of 0.5 mm and less incurs increased technical difficulties.

The problem which arises when conventional guide paths are used for components which are extremely thin, with thickness values of, for example, 0.5 mm and less, can be seen in FIG. 2, which shows a longitudinal section through a guide path 1 according to the prior art and an electronic component 2 being guided therein in the form of an IC. Visible behind the component 2 is a part of a circular diaphragm aperture 3, from which light beams are emerging, being transmitted from a light barrier transmitter, not visible, arranged behind, so that the light beams can pass parallel to the floor of the guide channel and to the component 2 to a light inlet aperture arranged on the opposite side of the guide channel, this light inlet aperture being located in front of a receiver of the light barrier, not shown.

As can be seen from FIG. 2, the upper part of the diaphragm aperture 3 is not entirely covered by the component 2, since the height of the component 2 is not sufficient for this. Accordingly, light beams can pass above the component 2 to the receiver of the light barrier, as a result of which no reliable detection of the component 2 is possible.

With an alternative light barrier arrangement according to the prior art, in which the transmitter and receiver are arranged above and below, or, respectively, in front of and behind the guide path, so that the light beams fall perpendicularly onto a main surface of the component, these problems do not arise, since the main surface of the component is in any event large enough to provide an adequate darkening of the light barrier receiver. A disadvantage with such an alternative light barrier arrangement, however, is the fact that the guide path is substantially more difficult to access. For this reason, light barriers arranged laterally next to the guide paths are in many cases preferred.

The invention is based on the object of creating a guide path of the type referred to in the preamble for electrical components, which, with a lateral light barrier arrangement, guarantees reliable detection of even very thin components.

This object is resolved according to the invention by a guide path with the features of claim 1. Advantageous embodiments of the invention are described in the further claims.

The guide path according to the invention has guide elements, by means of which the components are guided, at least in the area of the light barrier, obliquely to the direction of the light beams, such that the component produces a shadow surface which is higher than the side face surface of the component.

As a result of the oblique position according to the invention of the components, i.e. due to the tilting of the components about their longitudinal axis, the side face surfaces of the components are no longer, or no longer exclusively, impinged on by the light beams but at least also a part of that main surface of the component which is slightly inclined in the direction of the transmitter, so that the shadow surface on the receiver side is enlarged accordingly. As a result, it is possible, in a very simple manner, and even with very thin components, to guarantee that the light inlet aperture adjacent to the component is sufficiently darkened on the light barrier receiver side to guarantee reliable detection of the component.

It is readily possible, for the guide path according to the invention to be designed in such a way that, following its oblique inclination area, another area follows in which the component is guided parallel to the plane of the light barrier beam.

Advantageously, the oblique position of the components relative to the main direction of the light beams 2 amounts to 2 to 30°, in particular 2 to 15°. In specific cases, even sharper oblique positions, for example up to 90°, may be expedient.

According to an advantageous embodiment, the guide elements comprise two longitudinal rails arranged next to one another on the floor of the guide channel, which are of different heights. As a result of this, the desired oblique position of the components can be easily attained.

Advantageously, the longitudinal rails have contact surfaces for the components, which run parallel to the floor of the guide channel, such that the components come into contact only on the edges of the longitudinal webs. The reduction of the contact surface reduces the effects of electrostatic discharges, as a result of which the components slide more easily along the longitudinal rails and the risk of "sticking" is reduced.

According to an advantageous embodiment, the guide elements comprise two guide webs located opposite the longitudinal rails and engaging above the components, in which the guide web opposite the lower longitudinal rail projects further into the guide channel than the guide web opposite the higher longitudinal rail, such that on both sides of the guide channel the distance interval between the longitudinal rail and the guide web allocated to it is at least essentially the same.

The invention is explained in greater detail hereinafter by way of examples on the basis of drawings. These show:

FIG. 1: A spatial representation of a guide path according to the invention;

FIG. 2: A longitudinal section through a guide path according to the prior art; and FIG. 3: A cross-section through the guide path from FIG. 1 in the area of a light barrier.

FIGS. 1 and 3 show a guide path 4 according to the invention with a middle path element 5 and two side path elements 6, 7, which are formed at least essentially symmetrically to one another and are arranged on opposite sides of the middle path element 5.

Located in the middle path element 5 is a guide channel 8 open towards the top, which extends in the longitudinal direction of the middle path element 5, over its entire length. The middle path element 5 accordingly has at least essentially a U-shaped cross-section with a floor section 9 and two side sections 10, 11, which project upwards over the floor section 9 and delimit the guide channel 8 laterally.

Provided at the floor of the guide channel 8 are two longitudinal rails 12, 13, arranged parallel to and at a distance from one another, which run parallel to the longitudinal axis of the guide path 4 and have different heights, i.e. project to different widths upwards over the floor of the guide channel 8.

The longitudinal rails 12, 13, serve as contact surfaces and slide rails for electronic components 2, such that these can slide along in the guide channel 8. The components 2 slide along at a corresponding oblique position or vertical arrangement of the guide path 1 on the basis of their force of gravity alone.

Because the longitudinal rails 12, 13, are of different heights, the components 2 are not arranged parallel to the floor of the guide channel 8 but obliquely to it. In the embodiment shown, the angle between the upper or lower main plane of the component 2 and the floor of the guide channel 8 is about 5°.

So that the components 2 cannot fall upwards out of the guide path 4, when there is a correspondingly steep arrangement of the guide path 4, the side path elements 6, 7, have cover sections 14, 15, which extend over the side sections 10, 11, of the middle path element 5 on one another inwards over the guide channel 8, so that they cover the guide channel 8 in its side areas.

The cover sections 14, 15, carry in their end areas guide webs 16, 17, projecting downwards, which are arranged approximately opposite the longitudinal rails 12, 13 but slightly further outwards than these. The guide web 16, which is located opposite the lower longitudinal rail 12, extends further downwards than the guide web 17, which is located opposite the higher longitudinal rail 13, so that the distance interval between the longitudinal rail 12 and the guide web 16 is of the same size as the distance interval between the longitudinal rail 13 and the guide web 17. This distance interval is selected in such a way that the components 2 which are to be conveyed can be taken up and guided with a desired degree of play between the longitudinal rails 12, 13, on the one hand, and the guide webs 16, 17 on the other. The lateral guidance of the components 2, by contrast is effected by the raised side sections 10, 11 of the middle path element 5.

In order to be able to determine the presence or absence of a component 2 at a specific point of the guide path 4, i.e. in the embodiment shown in FIG. 1 at the right-hand end of the guide path 4, at this point of the guide path 4 a light barrier is provided which is arranged laterally next to the guide path 4, this light barrier not being represented in any greater detail. The light barrier has a light-emitting transmitter, wherein the light is conducted via an optical fibre in the form of glass fibres into a side area of the guide path 4. The end of the optical fibre is secured in an aperture 18 of a retaining bracket 19, which is located at the side next to the guide path 4. The optical fibre emits a beam bundle 20, with an initially relatively large diameter. This beam bundle 20 impinges into another side aperture 21 with relatively large diameter and from there into a first diaphragm aperture 22 with a smaller diameter located in the side path element 6. In addition to this, a second diaphragm aperture 23 is provided in the side section 10, projecting upwards, of the middle path element 5, this second diaphragm aperture 23 being flush to the first diaphragm aperture 22 and having a diameter which is once again smaller, such that the light beam bundle passing through the second diaphragm aperture 23 has the desired small diameter.

The right half of the guide path 4 is formed symmetrically in relation to the light beam apertures, i.e. the side section 11 has a second diaphragm aperture 24, which is flush with the second diaphragm aperture 23 and has the same diameter as this, and the side path element 7 has a first diaphragm aperture 25 corresponding to the diaphragm aperture 22 and an outer side aperture 26 corresponding to the outer aperture 21.

On the side, next to the side path element 7, is located in turn a retaining bracket 26 with an aperture 27, which serves to retain an optical fibre, not further represented, which leads to the receiver of the light barrier.

The apertures described are arranged flush to one another in such a way that light beams which are emitted from the transmitter of the light barrier, i.e. in FIG. 3 from the left, pass through the individual apertures and the guide channel 8 to the light barrier receiver if there is no component 2 located in this area of the guide channel 8.

If, by contrast, a component 2 is located in the area between the two second diaphragm apertures 23, 24, the light beams are interrupted by the component 2, such that the diaphragm aperture 24 lies in shadow, as a result of which the light barrier receiver recognises the presence of the component 2. In this situation, the component 2 is located obliquely in the guide channel 8 in such a way that the left-hand face side area of the component 2 lies at least partially beneath the diaphragm aperture 24, while the right-hand face side area of the component 2 lies at least partially above the diaphragm aperture 24. As a result of this, the upper main surface 28 of the component 2 is irradiated obliquely, wherein the angle between the light beams and the main surface 28 in the embodiment shown is about 5°.

The longitudinal rails 12, 13, have face surfaces which are arranged parallel to the bottom of guide channel 8. The components 2, as a result of their oblique position, therefore lie in each case on only one edge of the 5 longitudinal rails 12, 13, such that a linear or sectional contact surface is provided for the components 2. As a result, the effect of electrostatic discharges and the inclination of the components 2 to remain stuck to the longitudinal rails 12, 13, are reduced.

The invention claimed is:

1. Apparatus providing a guide path for electronic components having side face surfaces, with a guide channel, in which the components are conducted past a light barrier which detects the components, said light barrier having a transmitter and receiver arranged laterally next to the guide path, such that the light beams are introduced from the side of the guide path into the guide channel, wherein the guide path has guide elements, by means of which the components are guided, at least in the area of the light barrier, obliquely to the direction of the light beams, the guide elements being structured to cause the components to produce shadow surfaces which are higher than the side face surfaces of the components, wherein the guide elements comprise a lower longitudinal rail and a higher longitudinal rail, and wherein a guide web opposite the lower longitudinal rail projects further into the guide channel than a guide web opposite the higher longitudinal rail, such that on both sides of the guide channel the distance interval between each longitudinal rail and each guide web allocated to it is at least essentially the same.

2. The guide path as claimed in claim 1, wherein the oblique position of the components relative to the main direction of the light beams amounts to 2 to 30°.

3. The guide path as claimed in claim 1, wherein the lower and higher longitudinal rails are arranged next to one another on the floor of the guide channel, and are of different heights.

4. The guide path as claimed in claim 3, wherein the longitudinal rails have contact surfaces for the components, which run parallel to the floor of the guide channel, such that the components come into contact only on the edges of the longitudinal rail.

5. Method for guiding electronic components having side face surfaces along a guide path with a guide channel, the method comprising:
   introducing light beams from a side of the guide path into the guide channel;
   projecting a guide web opposite a lower longitudinal rail further into the guide channel than a guide web opposite a higher longitudinal rail, such that on both sides of the guide channel the distance interval between the longitudinal rail and the guide web allocated to it is at least essentially the same;
   conducting the components past a light barrier having a transmitter and receiver arranged laterally next to the guide path, including guiding the components obliquely to the direction of the light beams with guide elements at least in the area of the light barrier;
   detecting the conducted components with the transmitter and receiver; and
   producing, with the components, shadow surfaces which are higher than the side face surfaces of the components.

* * * * *